United States Patent [19]

Childers et al.

[11] Patent Number: 4,926,197

[45] Date of Patent: May 15, 1990

[54] PLASTIC SUBSTRATE FOR THERMAL INK JET PRINTER

[75] Inventors: Winthrop D. Childers, San Diego; Chris Schantz, Redwood City; Eric Hanson, Burlingame, all of Calif.

[73] Assignee: Hewlett-Packard Company, Palo Alto, Calif.

[21] Appl. No.: 168,718

[22] Filed: Mar. 16, 1988

[51] Int. Cl.⁵ .......................... G01D 15/16; B41J 3/04
[52] U.S. Cl. .................................. 346/140 R; 361/387
[58] Field of Search ................ 346/140; 361/387, 386, 361/402; 174/16.3; 165/185, 80.3; 357/81; 437/902

[56] References Cited

U.S. PATENT DOCUMENTS

| | | | |
|---|---|---|---|
| 4,392,907 | 7/1983 | Shirato | 346/140 X |
| 4,394,670 | 7/1983 | Sugitani | 346/140 |
| 4,429,321 | 1/1984 | Matsumoto | 346/140 |
| 4,490,728 | 12/1984 | Vaught | 346/140 X |
| 4,639,277 | 1/1987 | Hawkins | 437/902 X |
| 4,723,129 | 2/1988 | Endo | 346/140 X |

Primary Examiner—Joseph W. Hartary
Attorney, Agent, or Firm—Roland I. Griffin

[57] ABSTRACT

A substrate for the print head of an ink jet printer includes a plastic base, a metallization layer overlying the plastic base, and a dielectric structure overlying the metallization layer. A thin film resistor is deposited over the substrate, as required. Acceptable materials include polyimide plastic for the base, copper or nickel for the metallization layer, and a bilayer construction of silicon dioxide overlying chromium or titanium for the dielectric structure.

12 Claims, 1 Drawing Sheet

PLASTIC SUBSTRATE FOR THERMAL INK JET PRINTER

BACKGROUND OF THE INVENTION

This invention relates to printers, and, more particularly, to the substrate component of the print head of thermal ink jet printers.

Thermal ink jet print heads operate by rapidly heating a small volume of ink, causing it to vaporize and expand, and ejecting the ink through an orifice to strike a piece of paper. When a number of orifices are properly arranged, they form a dot matrix pattern. The properly sequenced operation of each orifice causes a pattern of characters or images to be printed upon the paper as the print head is moved past the paper. The thermal ink jet printer is fast but quiet, as only the ink strikes the paper, produces high quality printing, and can be made compact and portable.

In one design, the print head includes an ink reservoir and channels to supply the ink to the point of vaporization, an orifice plate in which the individual orifices are formed in the required pattern, a series of thin film heaters, one below each orifice, and a substrate which forms the back wall of the ink channel and upon which the heaters are supported. Each heater includes a thin film resistor and appropriate current leads. To print a single dot of ink, electrical current from an external power supply is passed through a selected heater. The heater is ohmically heated, in turn heating the adjacent ink and causing a droplet of ink to be ejected through the adjacent orifice to the paper.

The present invention is concerned with the construction of the substrate. The substrate supports the resistors and their current carrying leads, and must therefore be electrically nonconducting in the sense of serving as an insulator between the laterally adjacent resistors and leads. The substrate must have a low enough thermal conductivity to limit the portion of the heat pulse of the resistors conducted into the substrate. Otherwise, excessive driving energy may be required. The substrate must, however, have sufficient thermal conductivity that the portion of the heat pulse of the resistor conducted into the substrate is dissipated. Otherwise, there may be a heat buildup under the resistor that degrades print quality and reduces resistor reliability. Meeting the requirements of low electrical conductivity and moderate thermal conductivity necessitates care in the selection of the substrate construction. In addition, the substrate must have good mechanical strength to withstand the hydrodynamic forces produced during the ink ejection cycle.

Substrates have been conventionally fabricated from pieces of silicon or glass, covered with a dielectric layer such as silicon dioxide. These constructions are fully operable and acceptable. Nevertheless, there is a continuing need for improved substrate materials and designs that permit less costly fabrication and better performance of the substrate and the print head. The present invention fulfills this need, and further provides related advantages.

SUMMARY OF THE INVENTION

The present invention resides in an improved substrate material and construction that provides both operational and cost advantages over prior substrates. As compared with prior substrate constructions, the improved substrate is more stable in basic inks, yielding longer life, and is more readily configured by secondary fabrication. Electrical interconnections for the heater circuits are simplified. The substrate is less costly to fabricate, due to the use of less expensive materials, and due to use of a semi-continuous processing procedure rather than a batch procedure. These cost considerations are particularly important because the print head is disposable.

In accordance with the invention, a thermal ink jet printer substrate comprises a plastic base, a metallization layer overlying the plastic base, and a dielectric structure overlying the metallization layer. The base is preferably a polyimide plastic, and the metallization layer is preferably copper or nickel deposited upon the plastic. The dielectric structure may include a single layer of dielectric material or multiple layers, at least one of which is a dielectric. The dielectric structure preferably includes a thin metal adhesion layer, such as titanium or chromium, overlying the metallization layer, and a layer of a dielectric material, such as silicon dioxide, overlying the adhesion layer.

The present substrate replaces glass or silicon, as used in prior substrates, with plastic. The benefits of the present invention flow from this selection of a plastic substrate. The use of plastic was not previously possible, due to its low thermal conductivity, about 1/5 that of glass and 1/400 that of silicon. The addition of the thermally conductive metallization layer, between the plastic base and the dielectric structure, provides the necessary thermal conductivity to dissipate heat produced by the operation of the thin-film heaters. Absent the metallization layer, heat would build up in the regions of the substrate beneath the heaters, causing degradation of print quality and possible failure of the print head. The metallization layer is electrically isolated from the thin-film heater by the dielectric structure, so that the substrate is sufficiently electrically nonconductive for the heaters to be operated independently of each other.

The metallization layer and the dielectric structure have maximum service temperatures higher than the peak resistor temperatures. The addition of the metallization layer of suitable thickness and the dielectric structure of suitable thickness, between the plastic base and the resistor, permits the use of plastics having maximum service temperatures lower than the peak resistor temperature. The use of such plastics in the base was not previously possible.

The dielectric layer is from about 0.1 to about 10 micrometers thick, preferably from about 0.1 to about 2 micrometers thick. The metallization layer is from about 0.1 to about 400 micrometers thick, most preferably from about 10 to about 25 micrometers thick. The thicknesses of the dielectric layer and the metallization layer can be adjusted to optimize the thermal transfer ratio, the ratio between the heat flowing into the ink and into the substrate.

More generally, then, a thermal ink jet printer substrate comprises a base having a thermal conductivity less than that of glass: a thermally conductive layer overlying the base, the conductive layer having a thermal conductivity of at least that of glass: and an electrically insulating structure overlying the conductive layer. The thermal conductivity of glass is sufficient for use in many thermal ink jet printer applications, but materials having thermal conductivities substantially below that of glass are inoperable due to the heat buildup problem. The conductive layer of the present invention permits the use of such low conductivity materials in the base.

In yet another aspect, a thermal ink jet printer substrate comprises a base having a thermal conductivity less than that of silicon, a thermally conductive layer overlying the base, the conductive layer having a thermal conductivity at least twice that of the base, and an electrically insulating structure overlying the conductive layer.

The present invention provides an important advance in the art of thermal ink jet printers. By separating the thermal conductivity and electrical insulation functions and providing those functions in an alternate construction, improved performance, improved fabricability, and reduced cost have been achieved. Print heads not realistically possible with other substrate materials can be constructed, such as large array print heads that are as wide as a page so that entire lines can be printed simultaneously. Other features and advantages will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
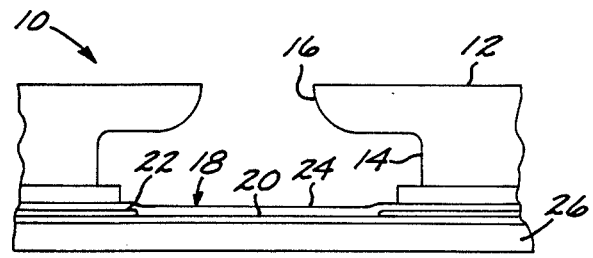
FIG. 1 is a side sectional view of a detail of a thermal ink jet print head.

A portion of a thermal ink jet printer head is presented in FIG. 1, showing the relation of the substrate to other major components. Referring to FIG. 1, a thermal ink jet printer head 10 includes an orifice plate 12 having an ink channel 14 therein. The orifice plate 12 has a number of orifices, including the illustrated orifice 16. Ink is drawn from a reservoir (not shown) to the region of the orifice 16 through the ink channel 14, by capillary action.

Opposite the opening of the orifice 16 is a heater 18. The heater 18 is a thin film resistor including a tantalum-aluminum planar resistor element 20 and aluminum or gold leads 22 connecting to the resistor element 20. A current is passed through the portion of the resistor element 20 between the ends of the leads 22, rapidly heating the resistor element. A small volume of ink adjacent the heater 18 is thereby rapidly heated and vaporized, causing some of the ink in the channel 14 to be ejected through the orifice 16. A passivation layer 24 overlies the heater 18, to protect it from corrosion by the ink. The passivation layer 24 is optional, and need not be used.

Figure 2:
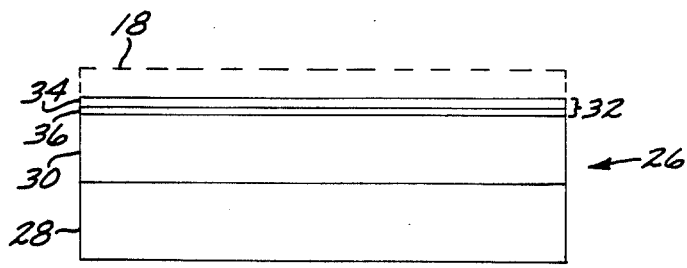
FIG. 2 is an enlarged side elevational view of the preferred construction of the substrate.

The heater 18 is supported on a substrate 26, which is shown in greater detail in FIG. 2, along with the overlying heater 18. The substrate 26 includes a plastic base 28, preferably formed of a polyimide plastic such as DuPont Kapton. The base can be of any required thickness, but is preferably from about 25 micrometers to about 3000 micrometers thick, most preferably from about 50 micrometers to about 300 micrometers thick. Plastic sheet of this thickness is available commercially on rolls, which can then be fabricated.

Overlying the base 28 is a metallization layer 30, made of a thermally conductive metal. Copper or nickel is preferred. The term "overlying" as used herein means that one layer is positioned over and in intimate contact with a second layer or structure. In this instance, the metallization layer 30 overlies the base 28. The metallization layer is preferably from about 0.1 to about 400 micrometers thick, most preferably from about 10 to about 25 micrometers thick. The metallization layer 30 acts as a heat sink, conducts heat, and laterally dissipates heat from the heater 18 that is positioned above the metallization layer 30. The use of this separate layer to control heat flow increases the design flexibility so that various rates of thermal dissipation can be incorporated into the system, as required, by adjusting the thickness of the dielectric layer and the metallization layer.

The metallization layer 30 also performs important functions in other respects. It moves the neutral axis of the substrate 26 toward the thin film heater 18 and related structure, reducing the likelihood of cracking during fabrication and thermal excursions. The metallization layer 30 improves the surface upon which the remaining structure of the substrate 26 and the heater 18 are deposited. The surface of the base 28, when the base is made of plastic, is normally irregular, but the metallization layer 30 smoothes the surface. It is possible to avoid the bonding of the tab circuit to the substrate with this approach, and the number of required parts or pieces is reduced.

Overlying the metallization layer 30 is a dielectric structure 32. The dielectric structure 32 includes a dielectric layer 34 of a material that has a low electrical conductivity. The preferred material for the dielectric layer is silicon dioxide, which has been previously used in substrate construction to achieve a controlled rate of heat loss from the resistor element to the underlying structure and as a mass diffusion barrier to prevent leaching of impurities. In its present application, the dielectric layer also electrically insulates the various resistor elements 20 and leads 22 from each other. The dielectric layer 34 is preferably from about 0.1 to about 10 micrometers in thickness.

Figure 3:
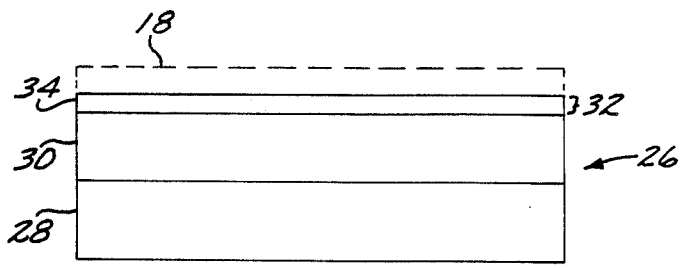
FIG. 3 is a view similar to that of FIG. 2, illustrating an alternative construction of the substrate.

Between the dielectric layer 34 and the metallization layer 30 is an optional adhesion layer 36. FIG. 2 illustrates the preferred substrate with an adhesion layer 36, and FIG. 3 illustrates another acceptable embodiment without the adhesion layer 36. The adhesion layer 36 is preferably a layer of titanium or chromium about 0.1 micrometer thick, which promotes adhesion between the dielectric layer 34 and the metallization layer 30. In the absence of the adhesion layer 36, there may be debonding and resulting delaminated regions between the layers 34 and 30.

The substrate of the present invention lends itself to mass production of printer heads, as the plastic base material is available in rolls that can be semi-continuously processed to completed substrates. To form a substrate, a plastic sheet unwound from the roll is continuously passed into a series of deposition steps. The metallization layer 30, adhesion layer 36 (if any), and dielectric layer 34 are successively deposited in a continuous fashion, as by sputtering or vapor deposition, or electroplating or electroless deposition for the metallic layers. This processing approach replaces the prior batch processing of substrate wafers, a significant improvement in view of the high production volume of printer heads. The resistor element layer is then applied to this prepared substrate material, followed by masking and deposition to produce the electrical leads. Vias can be formed through the substrate if desired, to permit backside electrical connection.

The substrate is then assembled with the orifice plate, heater elements, ink reservoir and other components to form the print head. The final assembled print head, loaded with ink, has a longer shelf life due to the use of the plastic substrate. The substrate of the invention is more stable in basic inks having a pH greater than 7, as compared with glass or silicon print heads. There is a lesser likelihood of corrosive failure of the plastic substrate during extended storage than with other substrate materials.

It will be appreciated that the approach of the invention yields important advantages in performance and fabricability as compared with prior approaches. Although a particular embodiment of the invention has been described in detail for purposes of illustration, various modifications may be made without departing from the spirit and scope of the invention. Accordingly, the invention is not to be limited except as by the appended claims.

What is claimed is:

1. A thermal ink jet printer print head, comprising:
   a plastic base;
   a metallization layer overlying said plastic base;
   a dielectric structure overlying said metallization layer, the dielectric structure including
   a metallic adhesion layer overlying said metallization layer, and
   a layer of a dielectric material overlying said metallic adhesion layer;
   a resistor overlying the dielectric structure; and
   an orifice plate with an orifice therein and an ink channel overlying the thin film resistor and the dielectric structure.

2. The print head of claim 1, wherein said plastic base is made of a polyimide plastic.

3. The print head of claim 1, wherein said metallization layer is copper.

4. The print head of claim 1, wherein said metallization layer is nickel.

5. The print head of claim 1, wherein said metallic adhesion layer is selected from the group consisting of titanium and chromium.

6. The print head of claim 1, wherein said dielectric material is silicon dioxide.

7. The print head of claim 1, wherein the thickness of said metallization layer is from about 0.1 to about 400 micrometers.

8. The print head of claim 1, wherein the thickness of said metallization layer is from about 10 to about 25 micrometers.

9. The print head of claim 1, wherein the thickness of said layer of dielectric material is from about 0.1 to about 10 micrometers.

10. The print head of claim 1, wherein the thickness of said plastic base is from about 25 to about 3000 micrometers.

11. The print head of claim 1, wherein the thickness of said plastic base is from about 50 to about 300 micrometers.

12. A thermal ink jet printer print head, comprising:
    a plastic base;
    a metallization layer overlying said plastic base;
    a dielectric structure overlying said metallization layer, the dielectric structure including
    a metallic adhesion layer overlying said metallization layer, and
    a layer of a dielectric material overlying said metallic adhesion layer; and
    means overlying the dielectric structure for ejecting a droplet of ink.

* * * * *